(12) United States Patent
Cho et al.

(10) Patent No.: US 8,829,155 B2
(45) Date of Patent: Sep. 9, 2014

(54) POLY(P-XYLYLENE)-BASED POLYMER HAVING LOW DIELECTRIC CONSTANT AND LOW-LOSS PROPERTY AND INSULATING MATERIAL, PRINTED CIRCUIT BOARD AND FUNCTIONAL ELEMENT USING THE SAME

(75) Inventors: Jae-Choon Cho, Suwon-si (KR); Andreas Greiner, Marburg (DE); Do-Yeung Yoon, Seoul (KR); Jun-Rok Oh, Seoul (KR); Keun-Yong Lee, Suwon-si (KR); Moon-Soo Park, Suwon-si (KR)

(73) Assignee: Samsung Electro-Mechanics Co., Ltd., Gyunggi-Do (KR)

( * ) Notice: Subject to any disclaimer, the term of this patent is extended or adjusted under 35 U.S.C. 154(b) by 180 days.

(21) Appl. No.: 12/370,313

(22) Filed: Feb. 12, 2009

(65) Prior Publication Data
US 2010/0048858 A1   Feb. 25, 2010

(30) Foreign Application Priority Data
Aug. 28, 2008  (KR) ........................ 10-2008-0084747

(51) Int. Cl.
C08G 61/02   (2006.01)

(52) U.S. Cl.
CPC .............. *C08G 61/025* (2013.01); *C08G 61/02* (2013.01); *C08G 2261/148* (2013.01); *C08G 2261/3424* (2013.01)
USPC ............ 528/397; 528/220; 528/232; 528/396

(58) Field of Classification Search
USPC .................................. 528/220, 232, 396, 397
See application file for complete search history.

(56) References Cited

U.S. PATENT DOCUMENTS

| 6,127,038 A * | 10/2000 | McCullough et al. ........ 428/416 |
| 2007/0099019 A1* | 5/2007 | Hanefeld et al. .............. 428/548 |
| 2009/0186998 A1* | 7/2009 | Hanefeld et al. .............. 526/251 |

FOREIGN PATENT DOCUMENTS

| JP | 2000-003909 A | 1/2000 |
| WO | WO 2006/089531 A2 | 8/2006 |
| WO | WO 2007/055822 A2 | 5/2007 |

OTHER PUBLICATIONS

S. Szunerits, J. H. P. Utley, and M. F. Nielsen, "Electro-organic reactions. Part 50. Quinodimethane chemistry. Part 1. Electrochemical generation and characterisation of p-quinodimethanes", J. Chem. Soc., Perkin Trans. 2 2000, 2(4), 669-675.*
Michael Ishaque, Ralf Wombacher, Joachim H. Wendorff, and Andreas Greiner, "Synthesis and structure-property relationships of novel poly(p-xylylene)s with aromatic substituents," e-Polymers 2001, No. 005, pp. 1-16.*
Korean Office Action, with Partial English Translation, issued in Korean Patent Application No. 10-2008-0084747, dated Jan. 25, 2010.
C. Belton et al., "Excited-state quenching of a highly luminescent conjugated polymer," Applied Physics Letters, vol. 78, No. 8, 2001, pp. 1059-1061.
Japanese Office Action issued in Japanese Application No. 2009-068529 issued on May 15, 2012.

\* cited by examiner

*Primary Examiner* — Richard A Huhn
(74) *Attorney, Agent, or Firm* — McDermott Will & Emery LLP

(57) ABSTRACT

The present invention relates to a poly(p-xylylene)-based polymer having a low dielectric constant suitable for low loss dielectrics (LLD), and an insulating material, a printed circuit board and a functional element using the same. More particularly, the poly(p-xylylene)-based polymer includes at least one repeat unit expressed by the following formula (1):

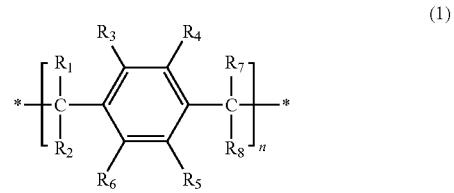

wherein, at least one of R1, R2, R7 and R8 is independently substituted or unsubstituted C6-C20 aryl;
the rest of R1 to R8 are each and independently H, substituted or unsubstituted linear C1-C3 alkyl, or substituted or unsubstituted branched C1-C3 alkyl; and
n is an integer of 400 to 900.

6 Claims, 4 Drawing Sheets

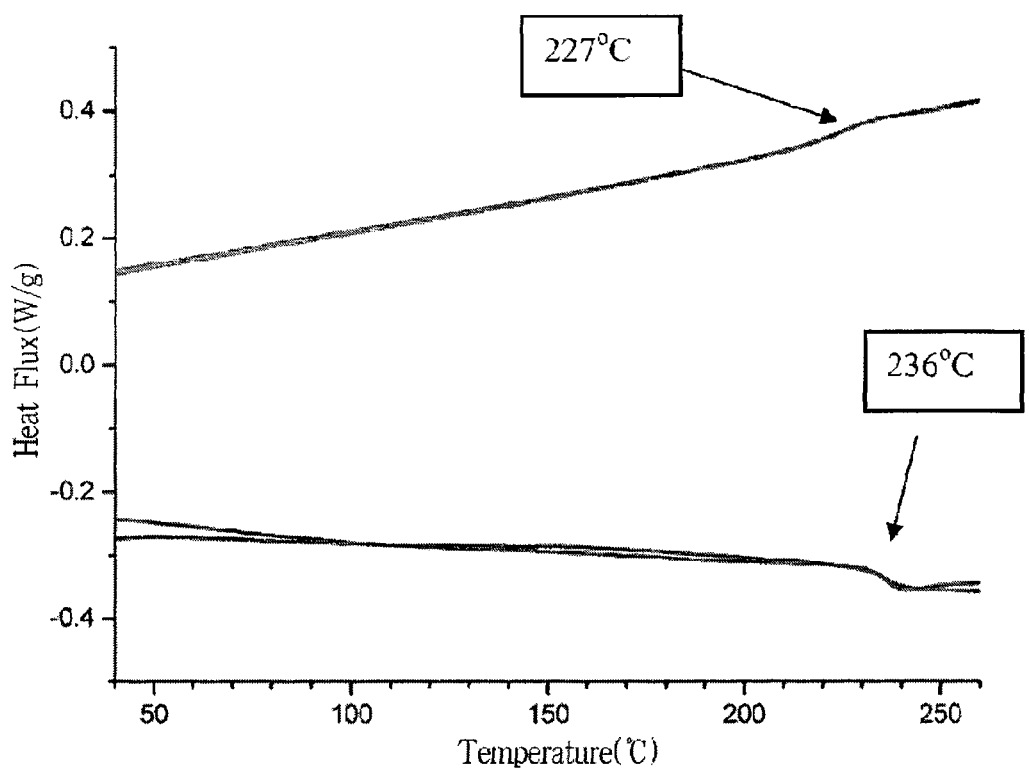

POLY(P-XYLYLENE)-BASED POLYMER HAVING LOW DIELECTRIC CONSTANT AND LOW-LOSS PROPERTY AND INSULATING MATERIAL, PRINTED CIRCUIT BOARD AND FUNCTIONAL ELEMENT USING THE SAME

CROSS-REFERENCE TO RELATED APPLICATIONS

This application claims the benefit of Korean Patent Application No. 10-2008-0084747 filed with the Korean Intellectual Property Office on Aug. 28, 2008, the disclosure of which is incorporated herein by reference in its entirety.

BACKGROUND

1. Technical Field

The present invention relates to a to a poly(p-xylylene)-based polymer having a low dielectric constant as a low loss dielectric (LLD), and an insulating material, a printed circuit board and a functional device using the same and more particularly, to a poly(p-xylylene)-based polymer including at least one repeat unit expressed by the following formula (1):

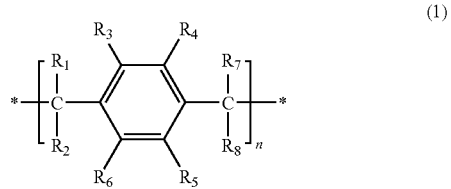

(1)

wherein, at least one of $R_1$, $R_2$, $R_7$ and $R_8$ is independently substituted or unsubstituted C6-C20 aryl;

the rest of $R_1$ to $R_8$ are each and independently H, substituted or unsubstituted linear C1-C3 alkyl, or substituted or unsubstituted branched C1-C3 alkyl; and n is an integer of 400 to 900, and an insulating material, a printed circuit board and a functional element using the same.

2. Description of the Related Art

Growth of integrated circuits has allowed miniaturization of circuits and further allowed multifunctional and high performing products with high integration. Accordingly, interposers, packages, and printed circuit boards, etc. for providing electrical connection between integrated circuits mounted and another component have moved toward high integration. All components have been mounted on the surface of a board in conventional multilayer boards. However, there has been a large demand for embedded PCBs with higher densities, greater capabilities and smaller sizes in which a great number or a part of components are incorporated into internal layers. A package or board providing size reduction by 3-dimensional mounting of components and improved electrical performance at a high frequency is called as an embedded PCB.

Embedded printed circuit boards are multilayer printed circuit boards in which semiconductors and passive components are mounted and have high density, high performance and/or high frequency characteristics. Minicaturization of integrated circuits with high density (large-scale integration) has been developed for the demand of smaller, thinner and lighter weight of electronic devices and has been possible with ultra-fine wirings of integrated circuits. However, due to concerns of reducing electric power consumption and mounting of chip components, embedded PCBs, in which passive components are used and of which passive components are directly incorporated into internal layers, have been more demanded. Low loss dielectric (LLD) is a board material to be used as insulating materials or functional devices (e.g., filter, etc.) of radio frequency embedded boards. Lower cross talk and lower transmission loss is required for electronic devices with smaller in size and higher frequency. Accordingly, there is a demand for researches on new insulating materials with low dielectric property and low loss and thus suitable for high frequency packaging and modules, etc. Materials having high Q value for embedding a filter and the like inside the package are also required for miniaturization. Low loss dielectrics play roles of insulating between wirings or between functional devices in the embedded PCB and of maintaining the strength of packages. Much higher-density wirings are also required in packages along with using ultra-fine wirings and operation of high density integrated circuits at higher frequencies. Since such high density wirings may cause noises between wirings, dielectric constant of insulating materials, parasitic capacitance and loss of dielectric have to be lowered to reduce insulating damages.

Benzocyclobuten (BCB) has been used for its excellent properties but cannot be suitable for printed circuit boards due to high cost. Liquid crystalline polymer (LCP) has also excellent properties but causes problems in the processing of printed circuit boards due to characteristics of thermoplastic resin. Therefore, it is highly demanded to develop new materials having insulating properties and processability.

SUMMARY

An aspect of the invention is to provide a novel poly(p-xylylene)-based polymer having low dielectric constant and processability as a low loss dielectric material, which is applicable for the material of embedded boards (e.g., insulating materials or functional elements), and an insulating material, a printed circuit board and a factional elements using the same.

Additional aspects and advantages of the present invention will be set forth in part in the description which follows, and in part will be obvious from the description, or may be learned by practice of the invention.

BRIEF DESCRIPTION OF THE DRAWINGS

FIG. 2 is a glass transition temperature graph of the polymer according to Example 1 of the invention determined by the differential scanning calorimetry

DETAILED DESCRIPTION

Figure 1:
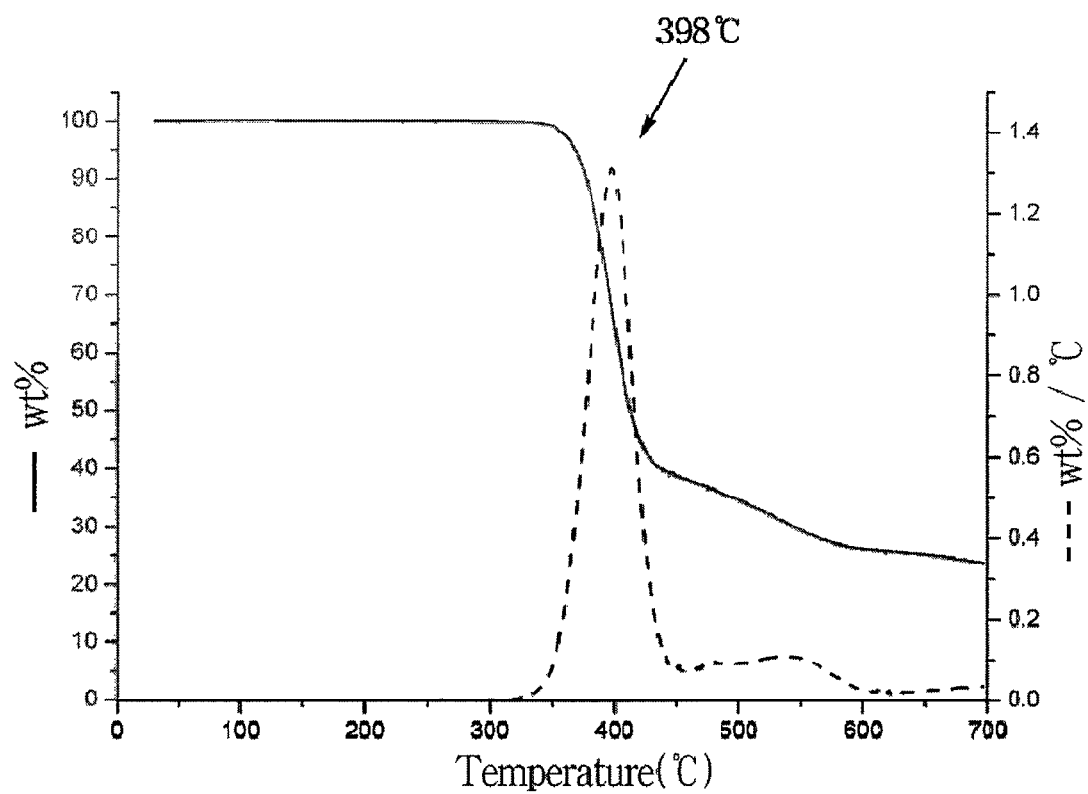
FIG. 1 is a pyrolysis temperature graph of the polymer according to Example 1 of the invention determined by the thermal gravimetric analysis.

The invention has been developed by preparing various poly(p-xylylene)-based polymers and conducting experiments to determine dielectric constants, dielectric loss factors, pyrolysis onset temperatures and glass transition temperatures of those polymers to provide novel insulating materials having low dielectric constant and processability as well as low loss property.

According to an aspect of the invention there is provided a poly(p-xylylene)-based polymer including at least one repeat unit of the following formula (1):

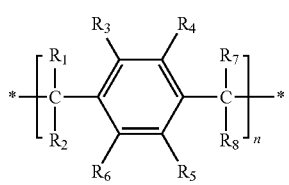

(1)

wherein, at least one of R1, R2, R7 and R8 is independently substituted or unsubstituted C6-C20 aryl;

the rest of R1 to R8 are each and independently H, substituted or unsubstituted linear C1-C3 alkyl, or substituted or unsubstituted branched C1-C3 alkyl; and n is an integer of 400 to 900.

The polymer may be a parylene which is composed of only hydrocarbons without any polar functional group. The polymer may be prepared without using any metal catalyst and have low dielectric property. In addition, the polymer has excellent thermal and mechanical properties so that it may be suitable for low dielectric board materials.

Further, the polymer may be also suitable for halogen-free products which are recently attracting much attention in the field of polymer board materials.

One of R1 and R2 of formula (1) may be substituted or unsubstituted C6-C20 aryl, one of R7 and R8 may be substituted or unsubstituted C6-C20 aryl, and the rest of R1 to R8 may be H.

According to an embodiment, the aryl may be chosen from aryl compounds expressed by the following formula (2).

(2)

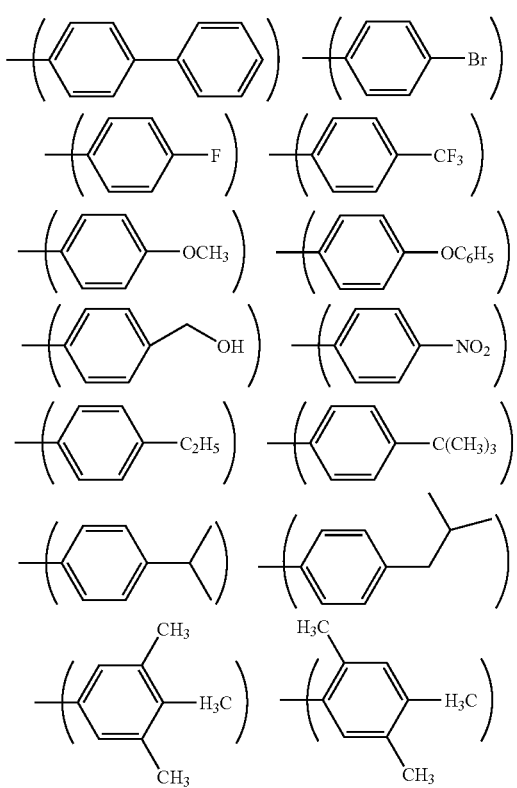

-continued

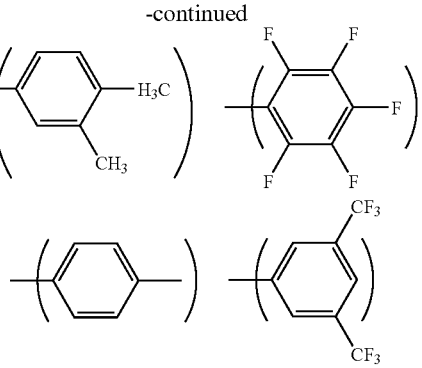
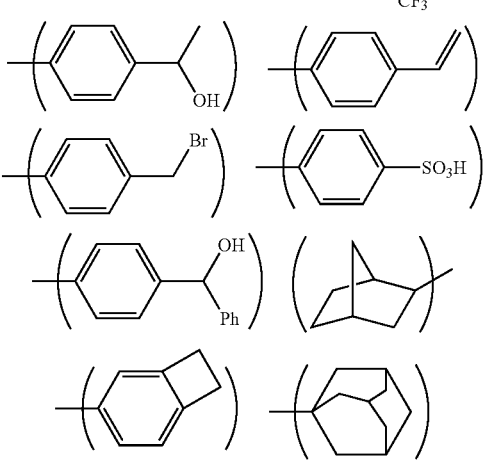

Further, the rest of R1 to R8 of formula (1), which are not aryl, may be H, substituted or unsubstituted linear C1-C3 alkyl, or substituted or unsubstituted branched C1-C3 alkyl, for example an alkyl chosen from methyl, ethyl, propyl, isopropyl, etc.

According to an embodiment, the poly(p-xylylene)-based polymer may be a poly(p-xylylene)-based polymer expressed by the following formula (3):

(3)

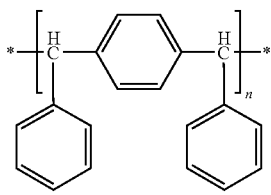

wherein n is an integer of 400 to 900.

The compound of formula (3) may be prepared by various methods, for example by preparing a monomer as a repeat unit through the following scheme 1 and polymerizing the monomers by the Gilch polymerization.

Scheme 1

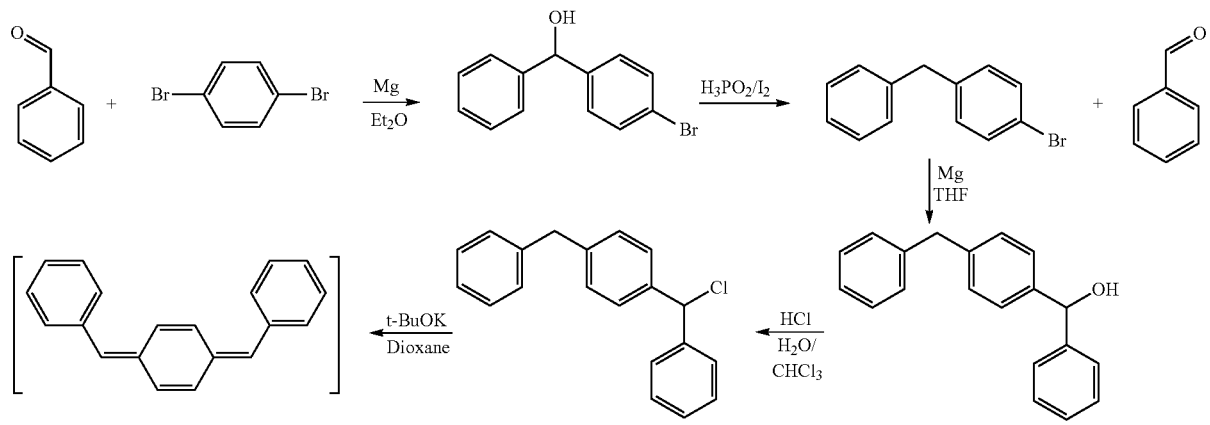

As described above, the poly(p-xylylene)-based polymer may have a dielectric constant in the range of from 2.0 to 3.0 at 1 GHz, a dielectric loss factor (tan δ) in the range of 0.001 to 0.005 at 1 GHz, a pyrolysis onset temperature in the range of 390° C. to 405° C., and a glass transition temperature in the range of 230° C. to 240° C. The poly(p-xylylene)-based polymer may not only maintain its own low dielectric characteristics but also exhibit excellent processability due to aryl groups.

The film prepared with the polymer according to an embodiment of the invention may begin pyrolysis at 350° C. or higher and have the glass transition temperature of 240° C. or higher so that it may have thermal and mechanical stabilities. Further, such prepared film may be transparent and flexible and exhibit good adhesion during the spin coating.

The poly(p-xylylene)-based polymer may be used as a low loss dielectric material.

According to another aspect of the invention, there is an insulating material formed by using the poly(p-xylylene)-based polymer. The insulating material may be used in embedded printed circuit boards or functional devices. The dielectric constant of the insulating material may be in the range of 1.0 to 3.0 at 1 GHz, preferably in the range of 1.0 to 2.0. And the dielectric loss factor may be in the range of 0.001 to 0.005 at 1 GHz, preferably in the range of 0.001 to 0.003.

A method for manufacturing organic substrates does not require a sintering process so that the manufacturing method can be simplified.

Further, the insulating material may be used as a resin of substrates and when it is used as a resin of a substrate, it may reduce noises between patterns and insulation losses. The insulating material may be used in any structure requiring a low dielectric property such as fillers of a substrate, insulating layers of a substrate and glass fibers without any limitation.

Further, the insulating material may be used in the embedded boards and functional devices in which a great number or a part of components can be embedded.

According to another aspect of the invention, there is an embedded printed circuit board or functional device including the insulating material.

According to another aspect of the invention, there is a method for manufacturing a poly(p-xylylene)-based polymer including: preparing arylaldehyde or arylalkylketone; conducting the grignard reaction after adding dihalobenzene into the prepared compound; conducting the reduction reaction; conducting the grignard reaction of the reduced compound with arylaldehyde or arylalkylketone; conducting the halogenation; and conducting the gilch polymerization.

According to an embodiment of the invention, the alkyl of the arylalkylketone may be H, substituted or unsubstituted C1-C3 linear alkyl, or substituted or unsubstituted C1-C3 branched alkyl.

According to an embodiment of the invention, the arly of the arylaldehyde and arlyalkylketone may be selected from the group of the following formula (2).

(2)

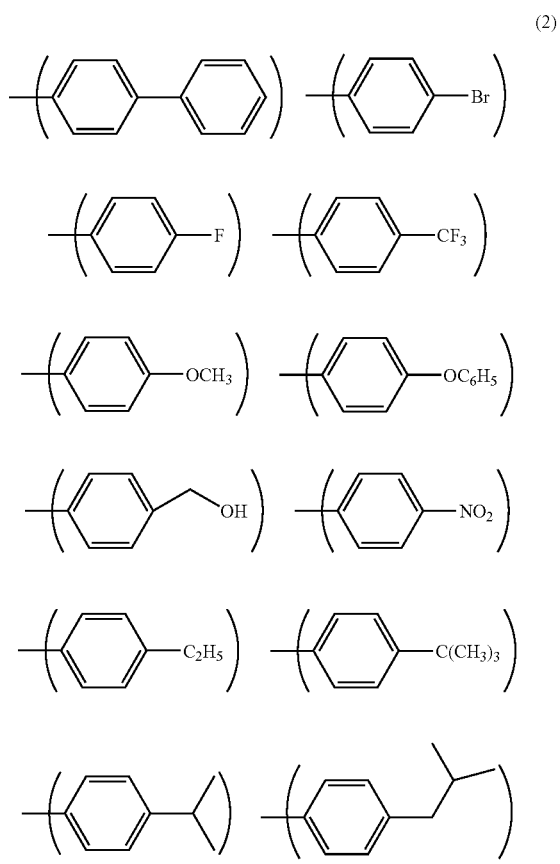

-continued

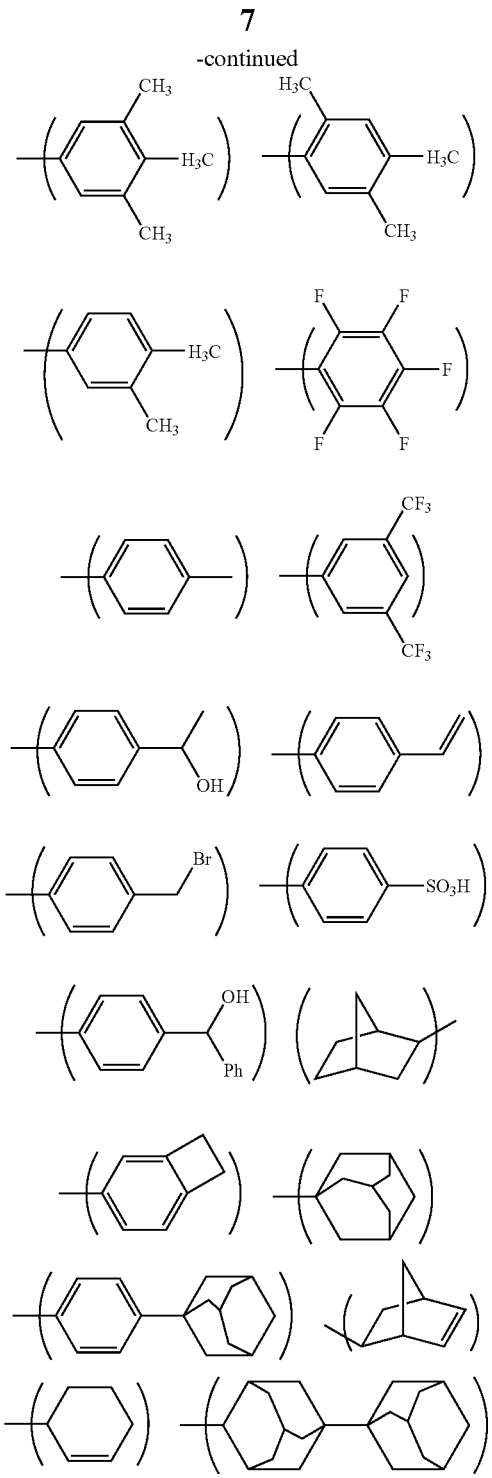

According to an embodiment of the invention, the the arylaldehyde is benzaldehyde, the arylalkylketone is phenylmethylketone, and the dihalobenzene is dibromobenzene.

According to an embodiment of the invention, low dielectric materials may be manufactured by using the poly(p-xylylene)-based polymer, the insulating material using the same, the printed circuit board and the functional device.

Hereinafter, although more detailed descriptions will be given by examples and preparation examples, those are only for explanation and there is no intention to limit the invention.

EXAMPLE 1

Preparation of Diphenyl poly(p-xylylene)-Based Polymer (1) Preparation of Monomer Scheme 2

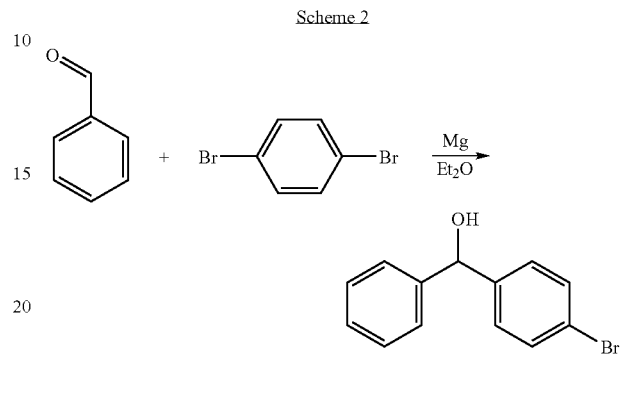

4-Bromobenzhydrol was first prepared as shown in Scheme 2. 14.6 g (600 mmol, 1.20 equiv.) Of magnesium flake in a 3-neck flask equipped with a dropping funnel and a reflux condenser was stirred in 50 ml of dried diethyl ether under Ar for 20 minutes. A small amount of iodine was added and the reaction solution was stirred for 20 minutes. 117.0 g (500 mmol, 1.00 equiv.) Of dibromobenzene in 500 ml of diethyl ether was added by drop-wise to the reaction solution. The reaction mixture was then refluxed for 1 hour. The reaction mixture was cooled to the room temperature and excess amount of magnesium flake was removed under Ar. Additional 47.7 g (450 mmol, 0.9 equiv.) of benzaldehyde dissolved in 400 ml of diethyl ether was added by drop-wise. The reaction mixture was refluxed for 2 hours and poured into ice-water. The reaction mixture was controlled to have pH 3 to 4 and then extracted with chloroform three times. The combined organic layer was neutralized with a saturated solution of $NaHCO_3$ and dried over $Na_2SO_4$. The solvent was evaporated and the result product was dried under vacuum for 5 hours. The product was analyzed by GC-MS to have 0.2% of dibromobenzene, 2.1% of benzhydrol, 86.3% of 4-bromobenzhydrol and 11.4% of α,α'-dihydroxydiphenyl-p-xylol. The product was then conducted for the reduction reaction.

Scheme 3

4-Bromodiphenylmethane was prepared as shown in Scheme 3. 4-Bromobenzhydrol in a 3-neck flask equipped with a reflux condenser and a thermometer was mixed with 500 ml of acetic acid, 113 g (445 mmol) of iodine and 226 ml, 50 wt. % of phosphorous acid (2.2 mol). The reaction mixture was heated at 80° C. for 24 hours and then cooled. 700 ml of ice-water was added to the reaction mixture and the reaction mixture was extracted with hexane (200 ml) 5 times. The combined organic layer was washed with 10 wt. % KOH solution and 200 ml of a saturated ammonium chloride solution and then further washed with a saturated $Na_2SO_3$ solution twice. The solvent was evaporated and the result product was dried under vacuum to provide a yield of 61% (276 mmol). BP: 103° C. ($5*10^{-2}$ mbar)

$^1$H NMR (400 MHz, $CHCl_3$) δ: 7.37-6.80 (m, 9H, ArH), 3.75 (s, 2H, $PhCH_2Ph$)

$^{13}$C NMR (400 MHz, $CHCl_3$) δ: 41.4 ($PhCH_2Ph$), 119.9 (ArC—Br), 140.6-126.2 (ArC)

Scheme 4

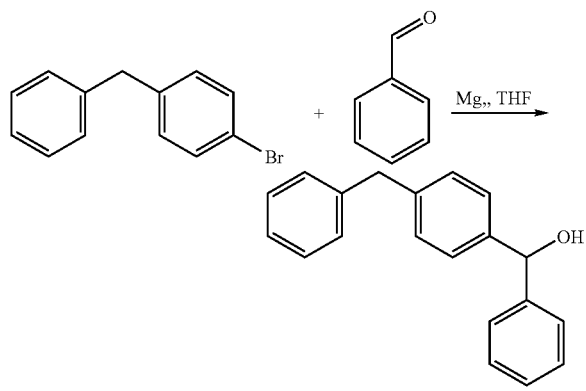

α,α'-Diphenyl-α-hydroxyl-p-xylene was prepared as shown in Scheme 4 by using 29.0 g (117 mmol) of 4-bromo diphenylmethane and 11.2 g (106 mmol) of benzaldehyde/ 19.7 g (106 mmol) by the similar procedure to the method for preparing 4-bromobenzhydrol. The crude product was dissolved in chloroform and filtered through G60 column filled with silica gel. After evaporating the solvent, the result product was recrystallized with hexane/chloroform (9:1 v/v) to provide a yield of 86%. MP: 64° C.

$^1$H NMR (300 MHz, $CDCl_3$) δ: 7.31-7.10 (m, 14H, ArH) 5.63 (s, 1H, —CHOH—, 3.86 (s, 2H, —$CH_2$—), 2.46 (s1H, —OH)

$^{13}$C NMR (75 MHz, $CDCl_3$) δ: 144.0-126.3 (ArC), 76.2 (—CH(OH)—, 41.8 (—$CH_2$—)

Scheme 5

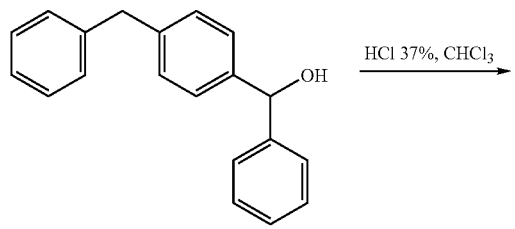

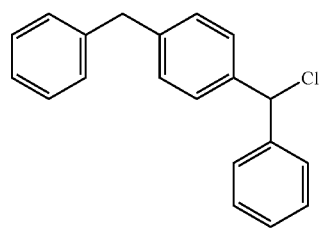

α,α'-Diphenyl-α-hydroxyl-p-xylene was chlorinated as shown in Scheme 5. 62 mmol of a corresponding alcohol in a 3-neck flask equipped with a dropping funnel and a reflux condenser was dissolved in 100 ml of chloroform and then cooled to 0° C. 60 ml of hydrochloric acid (37 wt. %) was slowly added to the reaction mixture and the reaction mixture was stirred at 0° C. for 20 minutes. The reaction mixture was then refluxed for 1 hour and then neutralized with a saturated $NaHCO_3$ solution. The organic layer was dried over $Na_2SO_4$. The solvent was evaporated and the result product was dried under vacuum for 5 hours. The crude product was dissolved in chloroform and filtered through G60 column filled with silica gel. The solvent was evaporated and the result product was recrystallized by hexane/chloroform (9:1 v/v) to provide a yield of 82%. MP: 73° C.

$^1$H NMR (300 MHz, $CDCl_3$) δ: 7.20-7.00 (m, 14H, ArH), 6.00 (s, 1H, —CHCl—, 3.86 (s, 2H, —$CH_2$—)

$^{13}$C NMR (75 MHz, $CDCl_3$) δ: 141.0-126.1 (ArC), 64.0 (—CH(Cl)—), 41.4 (—$CH_2$—)

(2) Preparation of poly(p-xylylene)-Based Polymer by Using Monomer

Scheme 6

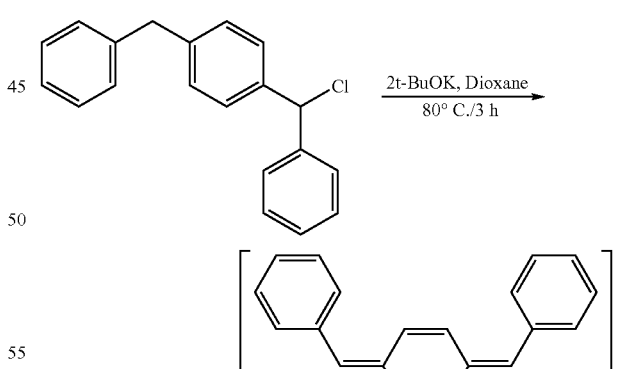

Intermediate stage

Intermediate stage

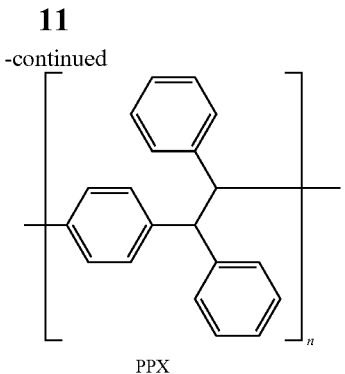

PPX

Diphenyl-polyxylene (Diph-PPX) was prepared by the gilch polymerization as shown in Scheme 6. 1.82 g (16.2 mmol, 2.0 equiv.) of potassium t-butoxide in a 3-neck flask was added to 85 ml of dried dioxane under Ar. The reaction mixture was heated to the boiling temperature and 8.1 mmol (1.0 equiv.) of fluoro monomer in 12 ml of dioxane was added to the boiling reaction mixture. The reaction mixture was refluxed for 3 hours and precipitated in 600 ml of methanol. The result precipitation was filtered and dried. It was redissolved in methanol and reprecipitated to provide a yield of 81%.

$^1$H NMR (300 MHz, CDCl$_3$) δ: 7.10-6.40 (m, 14H, ArH), 4.32 (s, 2H, PhCH—CHPH—)

$^{13}$C NMR (75 MHz, CDCl$_3$) δ: 143.3-125.5 (ArC), 56.0 (PhCH—CHPH)

(3) Determination of Properties of the Polymer Prepared in Example 1

Thermal Gravimetric Analysis, TGA

Thermal gravimetric analysis was conducted by using TGA2050 of TA Instruments Inc. 10 mg of a polymer sample was used and heated to 700° C. under N$_2$ at a rate of 10° C./min.

The result is shown in FIG. 1. As shown in FIG. 1, it is noted that the polymer has the pyrolysis temperature of higher than 350° C. and exhibits thermal stability.

Differential Scanning Calorimetry, DSC

Differential scanning calorimetry was conducted by using DSC 2010 and DSC 2910 of TA Instruments Inc. Each 5 mg of a sample was used. Each sample was heated to 300° C. at a rate of 10° C./min and then cooled to 30° C. at a rate of 10° C./min. After the first scan of heating and cooling, each sample was conducted for the second scan.

The result is shown in FIG. 2. As shown in FIG. 2, it is noted that the polymer has the glass transition temperature of 240° C. or higher and exhibits thermal and mechanical stabilities.

Refractive Index and Film Thickness

Refractive index was determined by using a thin film analyzer, Filmetrics F20 of Filmetrics, Inc. at a wavelength of 632.8 nm. SiO$_2$ on a Si-wafer standard sample (thickness=7254.7 Å) was tested prior to determining samples. The polymer was dissolved in cyclohexane to be 12 wt. % solution, spin-coated on the Si-wafer for 30 seconds at 3000 rpm, and vacuum-dried at 60° C. for 1 day to obtain a uniform film on the Si-wafer. The film was transparent and had excellent flexibility and adhesion during the spin coating.

Dielectric Constant and Dielectric Loss tan δ and Preparation of Film

Dielectric constant was determined by a MIM (metal-insulator-metal) parallel capacitance. The polymer film was prepared by the following method described below. Polymer powder was placed in a mold having two halves made of Teflon. The mold was pressed by a couple of stainless steel platens and heated at a vacuum oven to 200° C. for 4 hours. It was cooled in water and the two halves of the mold were removed from the film by pulling away. Dielectric constant and dielectric loss tan δ were determined by using a RF impedance/material analyzer, Agilent E4001A of Agilent Technologies Inc., at a range of 1 MHz to 1 GHz. The film was loaded to a test head and a fixing part.

Figure 3A:
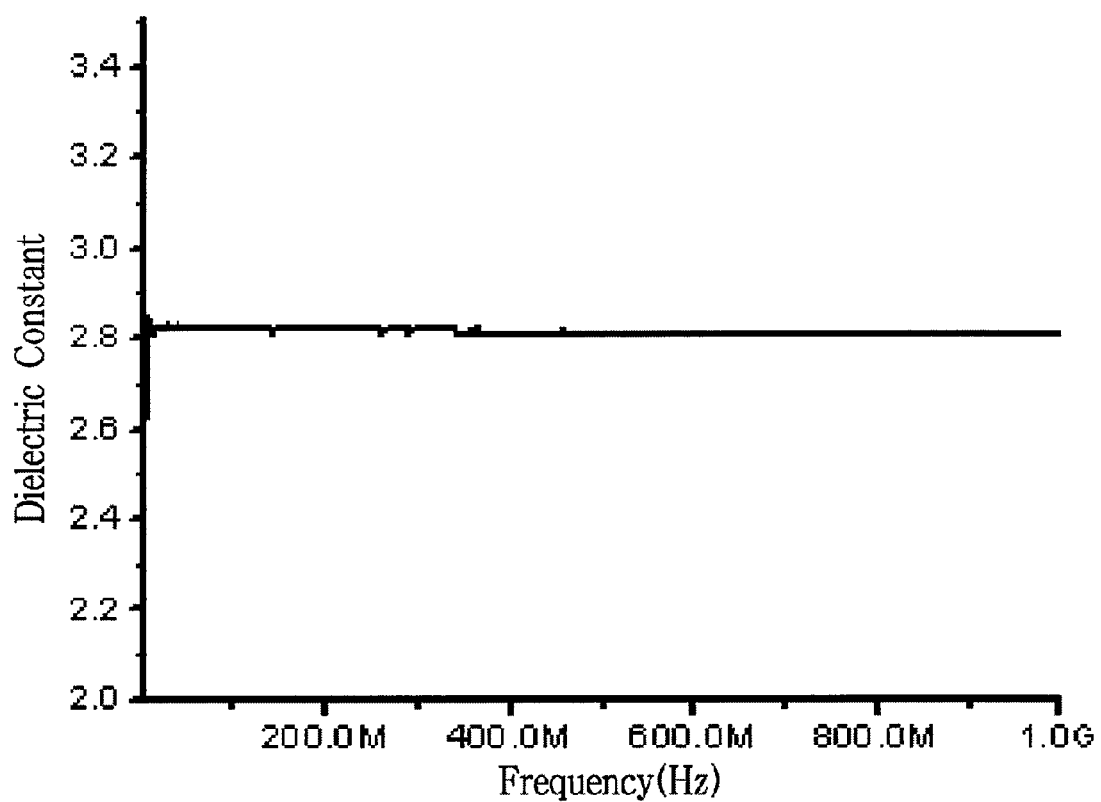
FIGS. 3a and 3b are dielectric loss tan δ graphs of the polymer according to Example 1 of the invention determined by the RF impedance/material analyzer.
Figure 3B:
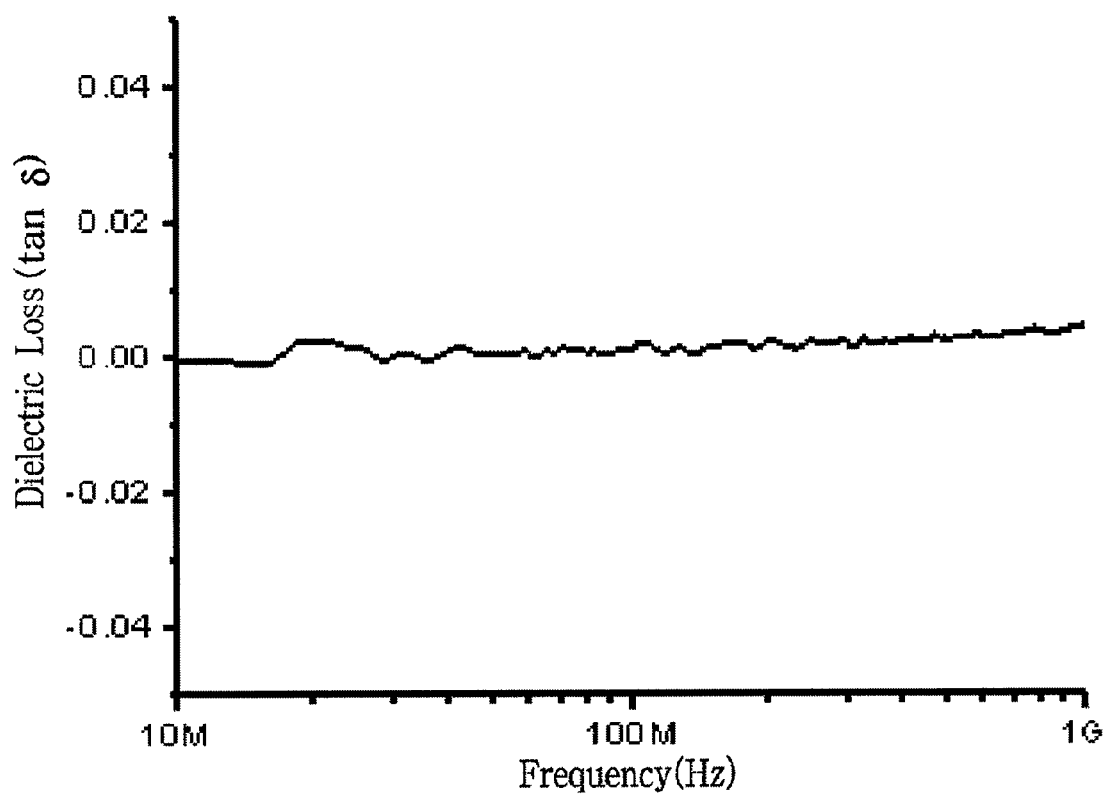

The result is shown in FIG. 3. As shown in FIG. 3, the dielectric loss tan δ was 0.002 to 0.003 and the low dielectric property was very good.

Physical Properties a) Molecular weight: Mn: 190,000, Mw/Mn: 2.4
b) Degree of polymerization (Dp): 400-900 monomer unit
c) Glass-transition temperature (Tg): 230 to 240° C.
d) TGA onset temperature range (T5%): 390 to 405° C.
e) Refractive index: 1.59
f) Solubility: Diphenyl poly(p-xylylene) was soluble in tetrahydrofuran (THF), chloroform (CHCl$_3$), acetone, toluene and all solvents including chloro atom(s).
g) Dielectric constant range: 2.8 at 500 MHz, 2.8 at 1 GHz
h) Dielectric loss range, Tan δ: 0.002 at 500 MHz, 0.003 at 1 GHz While the present invention has been described with reference to particular embodiments, it is to be appreciated that various changes and modifications may be made by those skilled in the art without departing from the spirit and scope of the present invention, as defined by the appended claims and their equivalents.

The present invention is not limited to those examples and it is also apparent that more changes may be made by those skilled in the art without departing from the principles and spirit of the present invention.

What is claimed is:

1. A poly(p-xylylene)-based polymer for electric insulation material of low dielectric loss having at least one repeat unit expressed by the following formula (1):

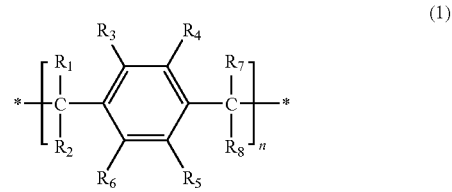

(1)

wherein one of R$_1$ and R$_2$ is a substituted or unsubstituted C$_6$-C$_{20}$ aryl group, one of R$_7$ and R$_8$ is a substituted or unsubstituted C$_6$-C$_{20}$ aryl group, and each of the rest of R$_1$ to R$_8$ is H, wherein the aryl groups are independently selected from the group consisting of:

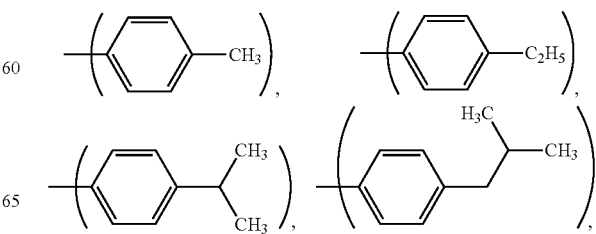

-continued

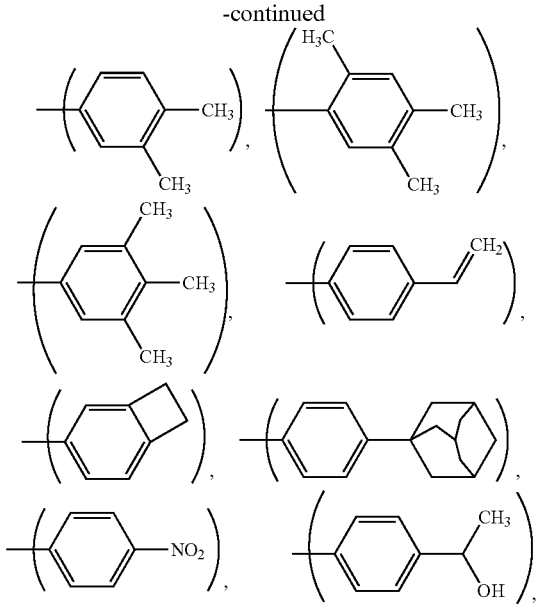

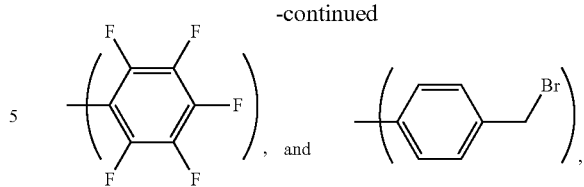

and wherein n is an integer of 400 to 900.

2. An insulating material formed by using the poly(p-xylylene)-based polymer for electric insulation material of low dielectric loss of claim 1.

3. The insulating material of claim 2, wherein the insulating material is used for embedded printed circuit boards or functional devices.

4. An embedded printed circuit board comprising the insulating material of claim 2.

5. A functional device comprising the insulating material of claim 2.

6. The poly(p-xylylene)-based polymer for electric insulation material of low dielectric loss of claim 1, wherein n is an integer of 700 to 900.

* * * * *